(12) United States Patent
Boulerne

(10) Patent No.: US 6,992,538 B1
(45) Date of Patent: Jan. 31, 2006

(54) INTERFEROMETRIC LOAD-PULL TUNER

(75) Inventor: Philippe Boulerne, 6980 Lacroix, Montreal, PQ (CA) H4E 2V3

(73) Assignee: Philippe Boulerne, Montreal (CA)

(*) Notice: Subject to any disclaimer, the term of this patent is extended or adjusted under 35 U.S.C. 154(b) by 0 days.

(21) Appl. No.: 10/894,073

(22) Filed: Jul. 20, 2004

(51) Int. Cl.
*H03H 7/38* (2006.01)
*G01R 27/00* (2006.01)

(52) U.S. Cl. ............... 333/17.3; 333/263; 324/642

(58) Field of Classification Search ............ 324/76, 324/49, 76.11, 76.51, 642; 333/17.3, 263
See application file for complete search history.

(56) References Cited

U.S. PATENT DOCUMENTS 6,674,293 B1 * 1/2004 Tsironis ............... 324/638

FOREIGN PATENT DOCUMENTS

JP 2000221233 A * 8/2000

OTHER PUBLICATIONS

Browne, "Coaxial Tuners Control Impedances to 65 GHz", Microwaves and RF, Jan. 2003.*

* cited by examiner

*Primary Examiner*—Stephen E. Jones

(57) ABSTRACT

The present invention discloses an interferometric load-pull tuner system consisting of a radio-frequency (RF) or microwave transmission line containing a pair of identical RF slugs sliding on the central conductor, said slugs surrounding partially the central conductor, being extractable from the transmission line, and the corresponding exact three-terms cascade procedure based on the scattering transfer parameters (T-Parameters) multiplication in order to calculate the scattering parameters (S-Parameters) of the interferometric load-pull tuner for any positions of the two slugs in the transmission line. The interferometric load-pull tuner of this invention provides improved measurement accuracy, enhanced reliability, and allows lower cost of manufacture and maintenance.

9 Claims, 9 Drawing Sheets

INTERFEROMETRIC LOAD-PULL TUNER

CROSS REFERENCE TO RELATED APPLICATIONS

U.S. Patent Documents

| | | | |
|---|---|---|---|
| 3851271 | November 1974 | Cooke et al. | 331/47 |
| 4267532 | May 1981 | Saleh | 333/33 |
| 4535307 | August 1985 | Tsukii | 333/35 |
| 4751480 | June 1988 | Kunz et al. | 333/129 |
| 5079507 | January 1992 | Ishida et al. | 324/645 |
| 5363060 | November 1994 | Kohno | 330/286 |
| 5406224 | April 1995 | Mikami et al. | 330/277 |
| 6297649 | Oct. 2, 2001 | Tsironis | 324/642 |
| 6674293 | Jan. 6, 2004 | Tsironis | 324/638 |

OTHER REFERENCES

LANGE Julius, Microwave Transistor Characterization Including S-Parameters, Texas Instruments, in Hewlett Packard Application Note 95

KESHISHIAN Richard, VSWR Tuner, MACOM Application Note AN0004

CUSACK Joseph M., PERLOW Stewart M., PERLMAN Barry S., Automatic Load Contour Mapping for Microwave Power Transistors; IEEE Transactions on Microwave Theory and Techniques, vol. MMT-22, No. 12, December 1974, pp 1146–1152.

SECHI F., PAGLIONE R., PERLMAN B., BROWN J., A Computer-Controlled Microwave Tuner for Automated Load Pull, RCA Review, vol. 44 Dec. 1983, pp 566–583.

PERLOW Stewart M., New Algorithms for the Automated Microwave Tuner System, RCA Review, vol. 46, September 1985, pp 341–355.

Patent Application Publication, U.S. 2003/0122633 A1, Jul. 3, 2003, Chistos Tsironis, "High Frequency, High Reflection Pre-Matching Tuners with Variable Zero Initialization"

Patent Application Publication, U.S. 2004/0119481 A1, Jun. 24, 2004, Chistos Tsironis, "Microwave Tuners for Wideband High Reflection Applications"

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to an electromechanical interferometric load-pull tuner system, and more particularly to such a system to be used in load-pull setup for the measurement, characterization and testing of RF (Radio-Frequency) or microwave devices. RF/Microwave tuners are electronic devices or mechanical devices which modify in a predictable way the complex impedance seen by the device under test (hereinafter referred to as "DUT") at a given frequency of operation. The interferometric load-pull has the capability of generating impedance to the microwave devices close to the conjugate complex of the DUT's internal impedance. This technique of subjecting DUT to variable load impedance or variable source impedance with corresponding load tuner and source tuner, commonly referred to as "load pull", is used to test transistors for amplifier, oscillator or frequency multiplier applications.

2. Description of Prior Art

A manual tuner with a manually extractable parallelepipedic dielectric slug has been described by KESHISHIAN Richard in "VSWR Tuner" MACOM Application Note AN0004. The manual tuner is constructed as a 50 ohm impedance air line (1), which contains a unique dielectric slug (3) sliding on a central conductor (2) and uses different slugs with different impedances, i.e. built with different pair of dielectric slabs (4,5), to transform the 50 ohm impedance to a pre-determined reflection amplitude and phase. The slug with its two identical dielectric slabs (4,5), basically acts as a shunt capacitor in parallel with the 50 ohm line. The value of this slug capacitance determines the value of the VSWR of the tuner, while the position of the slug in the transmission line dictates the phase. The unique slug is moved along the tuner, as indicated by arrow (3'), to provide full 360° VSWR circle coverage on the Smith chart. To get this full Smith chart coverage, the tuner must be designed for 180° minimum phase length at the lowest required frequency of operation. The value of the VSWR that each air/dielectric slug will provide is related to the permittivity Er of the slug dielectric and the air gap being left between the dielectric and the outer conductor.

To overcome the very time consuming process of using manual tuners, the slugs can be driven by motors controlled by a computer. A first automatic double-slug tuner is discussed in the article "Automatic Load Contour Mapping for Microwave Power Transistors" by J. M. Cusack, S. M. Perlow and B. S. Perlman, in IEEE Transactions on Microwave Theory and Techniques, Vol. MTT-22, No. 12, December 1974. The tuner consists of a uniform coaxial line with characteristic impedance Z0 of 50 Ohm (6). The line contains two identical moveable slugs (8,9) that slide, along the longitudinal axis of the coaxial line as indicated by arrows (8',9'), between the inner conductor (7) and the outer conductor (6), said inner conductor being the central conductor (7) of the coaxial line. The sections of line containing the slugs have characteristic impedance, Zs, which is lower than Z0. The cylindrical slugs could be purely dielectric (8,9) or dielectric (10,13)/metal (11,14)/dielectric (12,15) and are surrounding the central conductor (7) therefore being not extractable from the coaxial line. As the two slugs can not be extracted from the coaxial line, it is inevitable to calibrate the tuner at high gamma values and it is well known that vectorial network analyzers required for measuring the S-Parameters during the calibration become less and less accurate when very high reflection factor loads are to be measured, therefore limiting the possible accuracy of this calibration method.

The automatic slide-screw tuner consists of a coaxial 50 ohm characteristic impedance slabline (16), round center conductor (16), two slabs as outer conductor ground return (16) and uses only one metallic slug (17), movable in horizontal (17') and vertical (17") direction into a transmission line. It has been first described by LANGE Julius in "Microwave Transistor Characterization Including S-Parameters", Texas Instruments, Hewlett Packard Application Note 95. The search algorithm is extremely simple since the horizontal move of the slug corresponds to a phase variation of gamma, while the vertical move of the slug corresponds with an amplitude variation of gamma, making the impedance synthesis much easier compared to the previously described double-slug tuner. The main disadvantages of slide-screw tuner are power limitations and high gamma accuracy limitations. Power limitations are due to corona discharges that can take place between the tuning metallic slug (17) and the central conductor (18) at low impedance, i.e. high gamma. The greater the distance between the metallic slug and the central conductor, the more power can be transmitted, and conversely, the smaller the distance, the less power can be transmitted mainly because of corona discharge. Accuracy limitations also at low impedance are because of mechanical limitations to reproduce accurately a given slug position close to the central conductor.

One enhancement of slide-screw tuner is disclosed in C.A. Pat. No. 2,311,620 and U.S. Pat. No. 6,674,293 issued to Christos Tsironis on Jan. 6, 2004, which relates to a double slide-screw tuner that comprises a first (21) and a second (22) slugs in series in a transmission line (19), said first slug is adapted to act as a pre-matching section and said second slug is adapted to act as a tuning section. But as described in the patent, this technique being in reality two independent tuners connected in series with 4 axis of freedom, 2 horizontals (21',22') and 2 verticals (21",22"), the combined calibration time may be too long for practical considerations. Consequently, the patent provides alternative methods for calibrating the tuner to cut down the calibration time. But these calibration methods are based on approximations and give limited accuracy at high gamma. Also this tuner requires a additional sub-micron vertical positioning system for the second slug compared with the central conductor (20) which increases considerably the mechanical construction difficulty and the manufacturing cost.

Accordingly, there is a need for an efficient, economical, simply constructed and improved impedance tuner. It is another primary object of the invention to provide an exact three-terms procedure to calculate the S-parameters of the tuner with slugs displacement.

BRIEF SUMMARY OF THE INVENTION

The problem remaining in the prior art has been solved in accordance with the present invention which relates to a class of mechanical interferometric load-pull tuner comprising a slab-line, two identical RF slugs sliding along the slab-line longitudinal axis which are partially surrounding the central conductor in order to be manually extractable from the said slab-line.

In view of the foregoing, it is a primary object of this invention to provide a simple mechanical tuner in order to lower the cost of high precision vertical slug positioning.

Another primary object of this invention is to provide an interferometric tuner with an exact procedure for the calculation of the tuner S-Parameters for different positions of the two slugs.

BRIEF DESCRIPTION OF THE SEVERAL VIEWS OF THE DRAWING

FIG. 5: depicts a perspective view of an interferometric load-pull tuner with manually extractable parallelepipedic RF slugs

DETAILED DESCRIPTION OF THE INVENTION

Figure 1A:
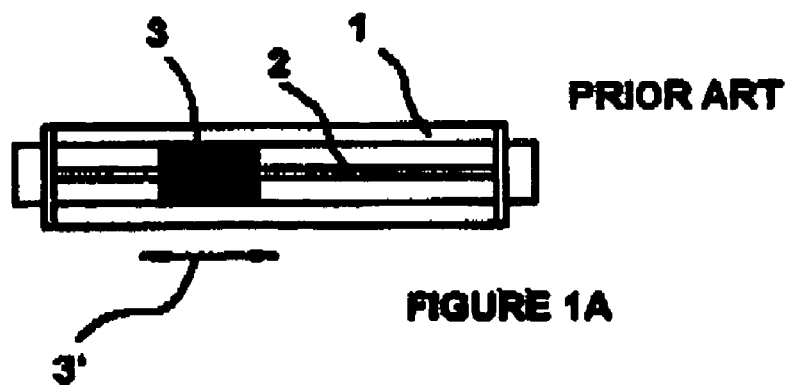
FIG. 1A: (Prior Art) depicts a top view of a manual constant VSWR single slug tuner
Figure 1B:
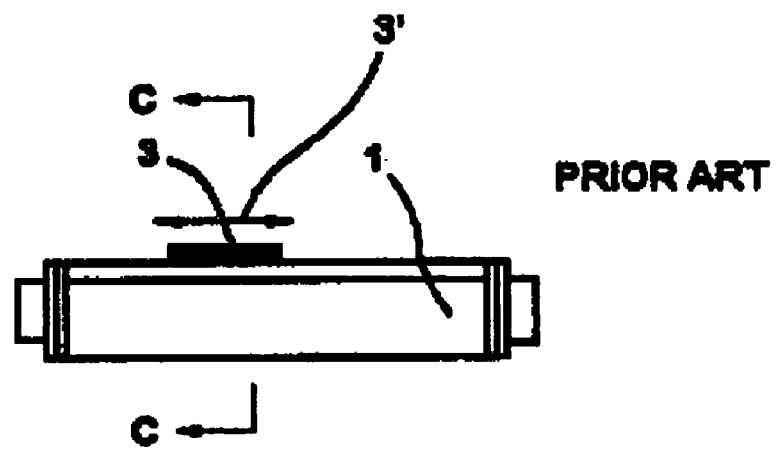
FIG. 1B: (Prior Art) depicts a side view of a manual constant VSWR single slug tuner
Figure 1C:
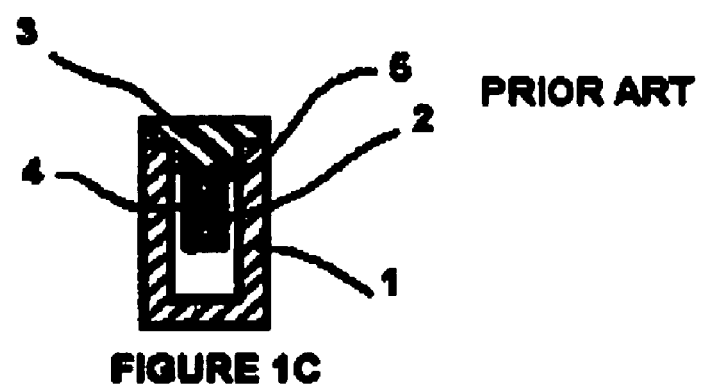
FIG. 1C: (Prior Art) depicts a cross sectional view of an extractable dielectric slug for manual constant VSWR tuners
Figure 2A:
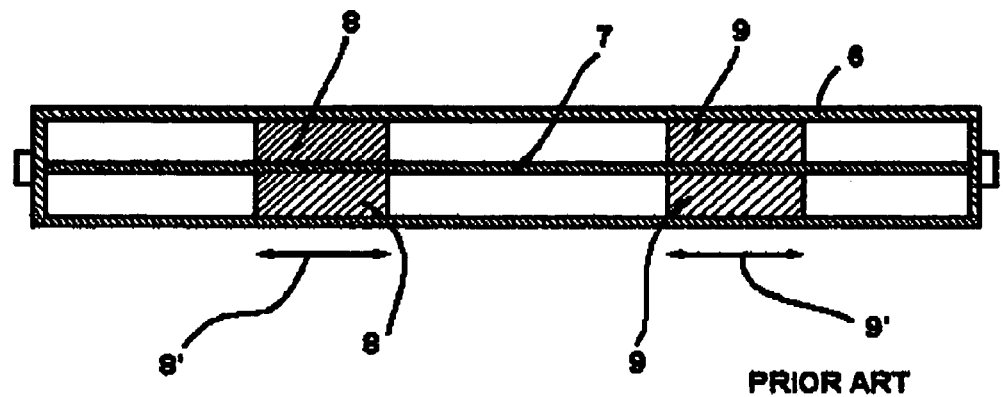
FIG. 2A: (Prior Art) depicts a cross sectional view of a double-slug tuner with pair of dielectric non extractable slugs surrounding the central conductor
Figure 2B:
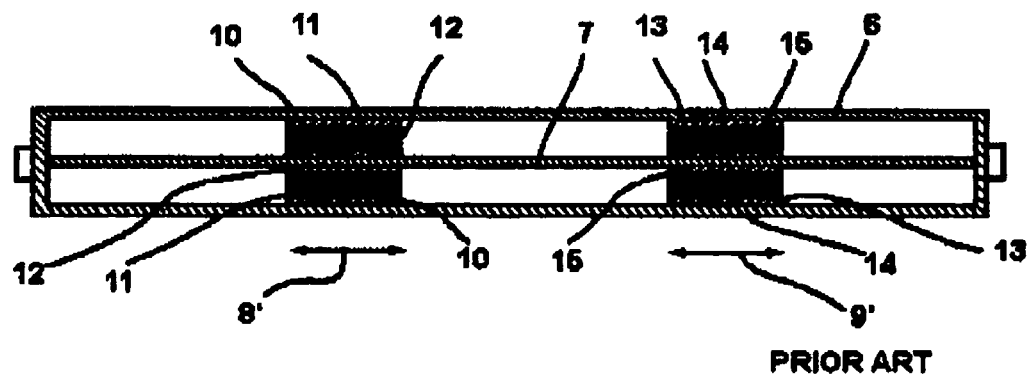
FIG. 2B: (Prior Art) depicts a cross sectional view of a double-slug tuner with pair of dielectric/metal/dielectric non extractable slugs surrounding the central conductor
Figure 3A:
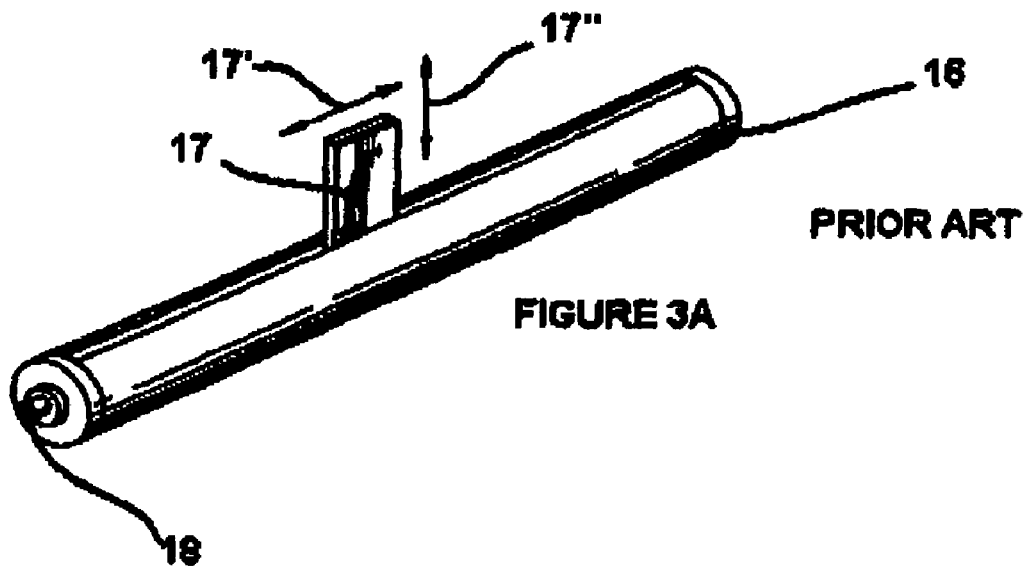
FIG. 3A: (Prior Art) depicts a perspective view of a slide-screw tuner with a metallic slug that can move up and down, but without ever touching the central conductor, and can also move horizontally along the longitudinal axis of the coaxial line.
Figure 3B:
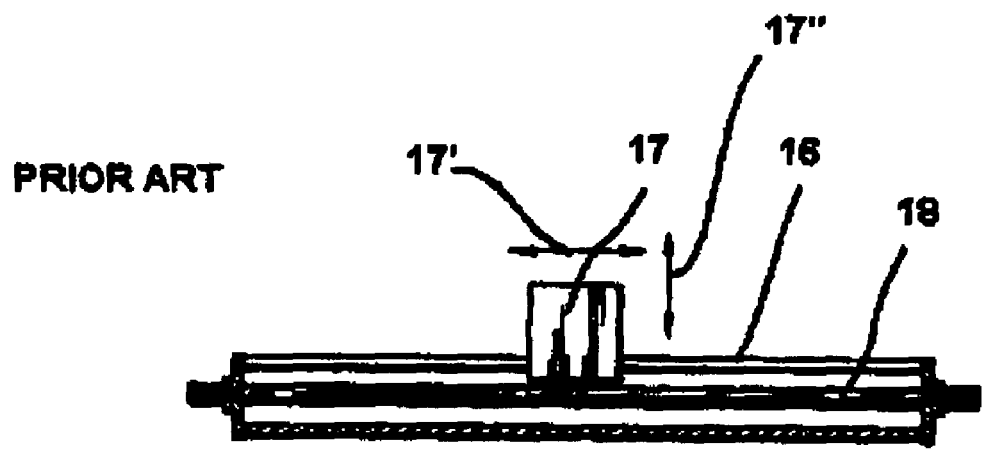
FIG. 3B: (Prior Art) depicts a cross sectional view of a slide-screw tuner
Figure 4A:
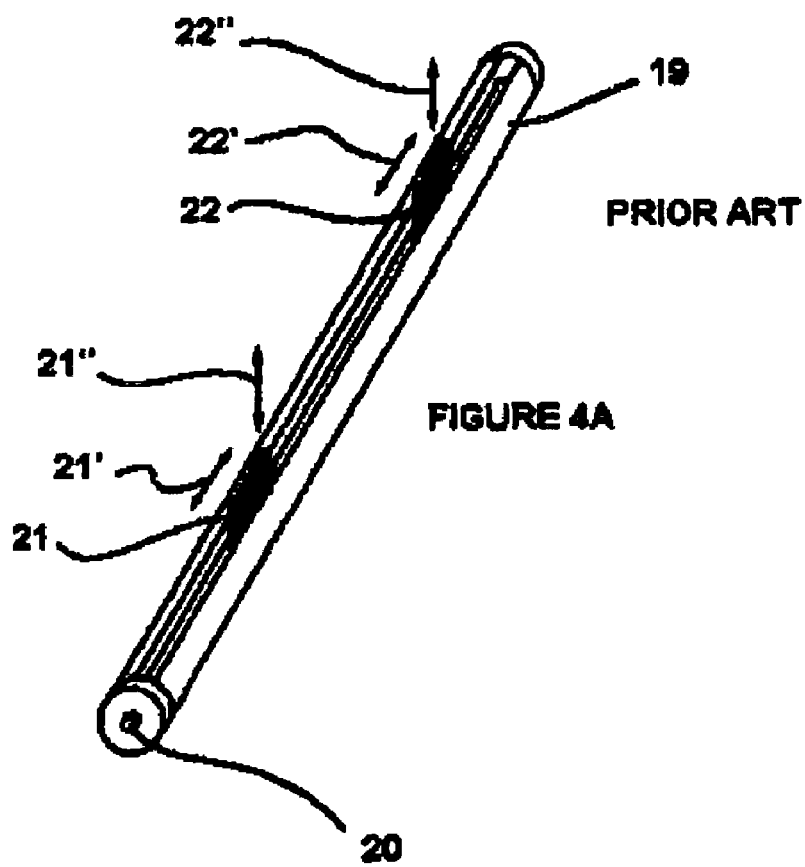
FIG. 4A: (Prior Art) depicts a perspective view of a double slide-screw tuner
Figure 4B:
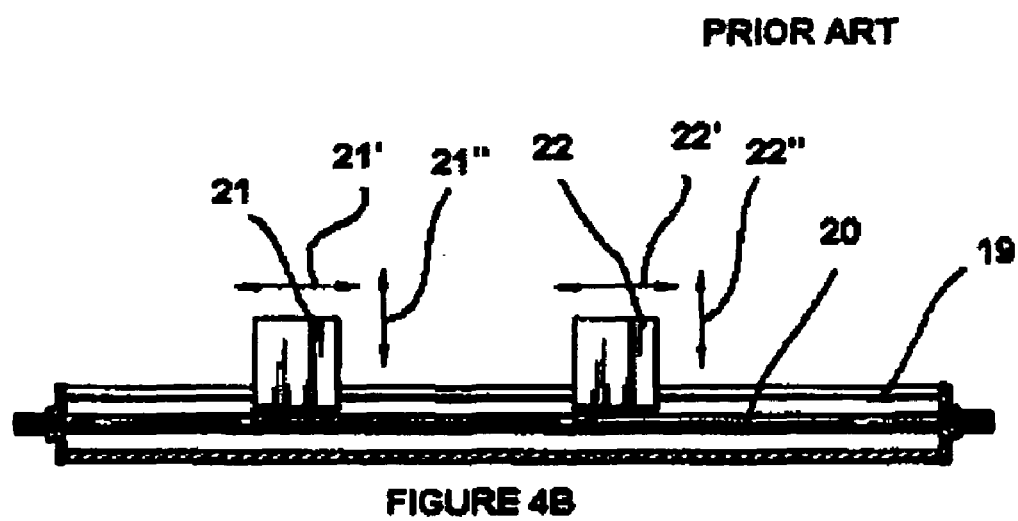
FIG. 4B: (Prior Art) depicts a cross sectional view of a double slide-screw tuner
Figure 6:
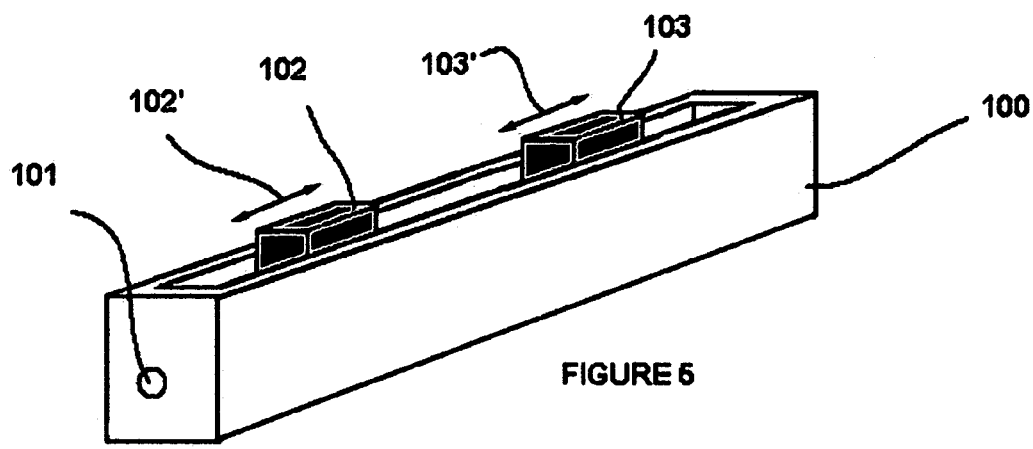
FIG. 6: depicts a top view of an interferometric load-pull tuner with manually extractable parallelepipedic RF slugs
Figure 6:
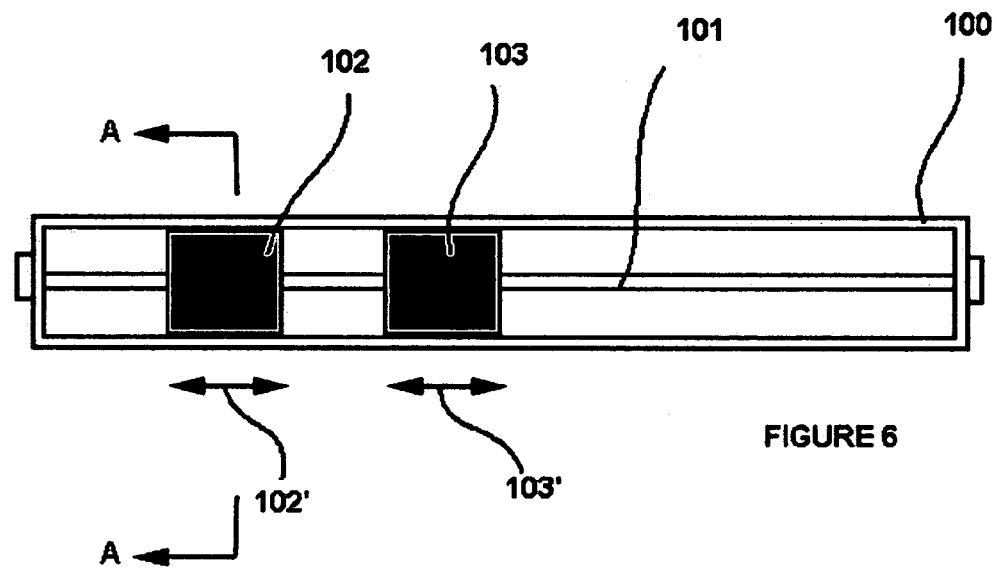
Figure 7A:
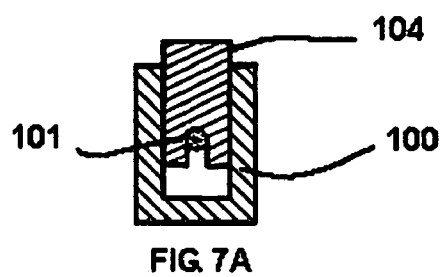
FIG. 7A: depicts a cross sectional view of a dielectric manually extractable parallelepipedic RF slug for circular inner conductor
Figure 7B:
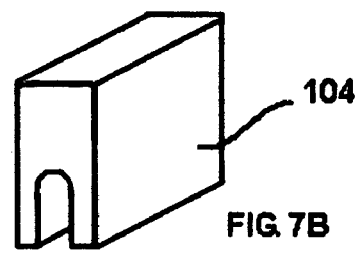
FIG. 7B: depicts a perspective view of a dielectric manually extractable parallelepipedic RF slug for circular inner conductor
Figure 8A:
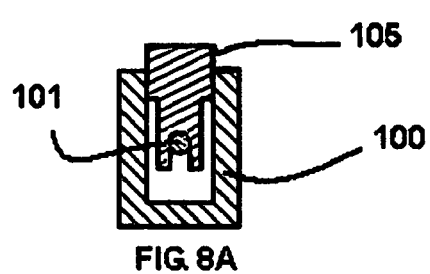
FIG. 8A: depicts a cross sectional view of an air/dielectric manually extractable parallelepipedic RF slug for circular inner conductor
Figure 8B:
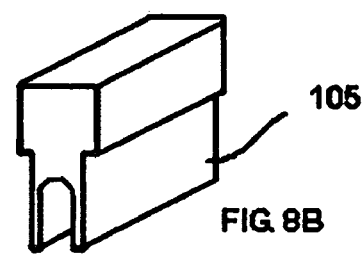
FIG. 8B: depicts a perspective view of an air/dielectric manually extractable parallelepipedic RF slug for circular inner conductor
Figure 9A:
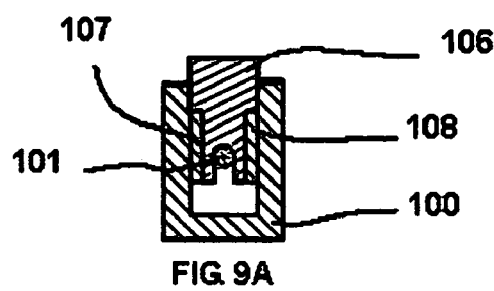
FIG. 9A: depicts a cross sectional view of a dielectric/metal manually extractable parallelepipedic RF slug for circular inner conductor
Figure 9B:
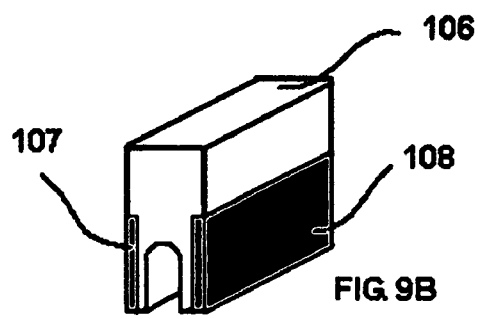
FIG. 9B: depicts a perspective view of a dielectric/metal manually extractable parallelepipedic RF slug for circular inner conductor
Figure 10A:
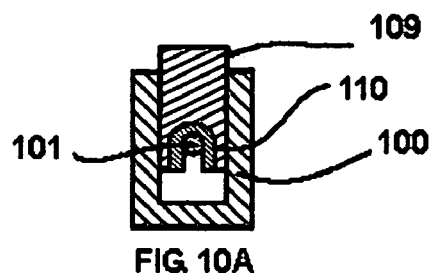
FIG. 10A: depicts a cross sectional view of a metal/dielectric manually extractable parallelepipedic RF slug for circular inner conductor
Figure 10B:
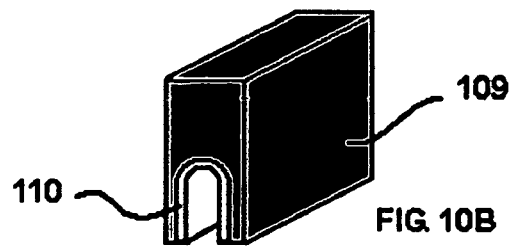
FIG. 10B: depicts a perspective view of a metal/dielectric manually extractable parallelepipedic RF slug for circular inner conductor
Figure 11A:
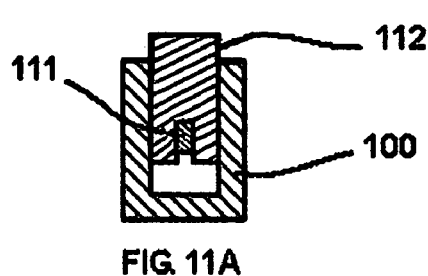
FIG. 11A: depicts a cross sectional view of a dielectric manually extractable parallelepipedic RF slug for rectangular inner conductor
Figure 11B:
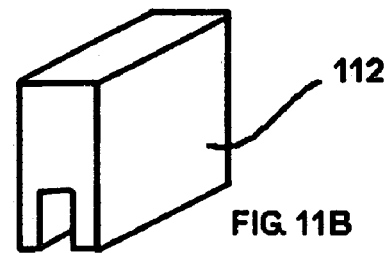
FIG. 11B: depicts a perspective view of a dielectric manually extractable parallelepipedic RF slug for rectangular inner conductor
Figure 12A:
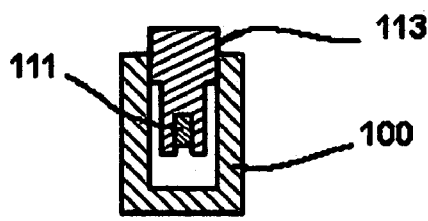
FIG. 12A: depicts a cross sectional view of an air/dielectric manually extractable parallelepipedic RF slug for rectangular inner conductor
Figure 12B:
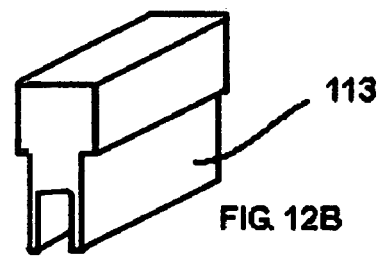
FIG. 12B: depicts a perspective view of an air/dielectric manually extractable parallelepipedic RF slug for rectangular inner conductor
Figure 13A:
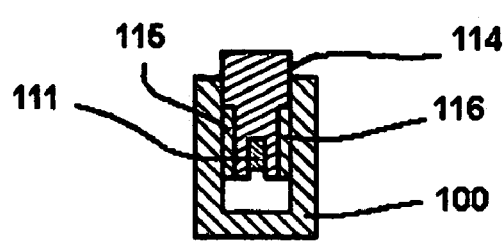
FIG. 13A: depicts a cross sectional view of a dielectric/metal manually extractable parallelepipedic RF slug for rectangular inner conductor
Figure 13B:
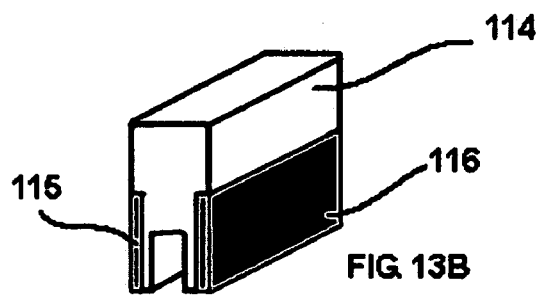
FIG. 13B: depicts a perspective view of a dielectric/metal manually extractable parallelepipedic RF slug for rectangular inner conductor
Figure 14A:
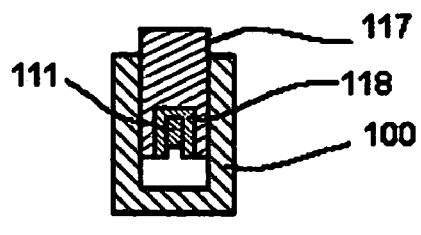
FIG. 14A: depicts a cross sectional view of a metal/dielectric manually extractable parallelepipedic RF slug for rectangular inner conductor
Figure 14B:
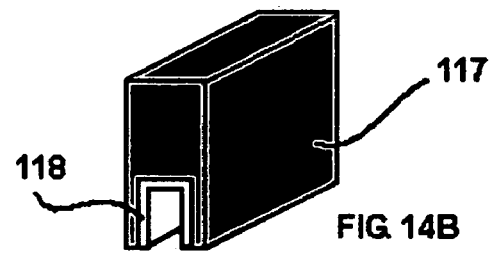
FIG. 14B: depicts a perspective view of a metal/dielectric manually extractable parallelepipedic RF slug for rectangular inner conductor
Figure 15:
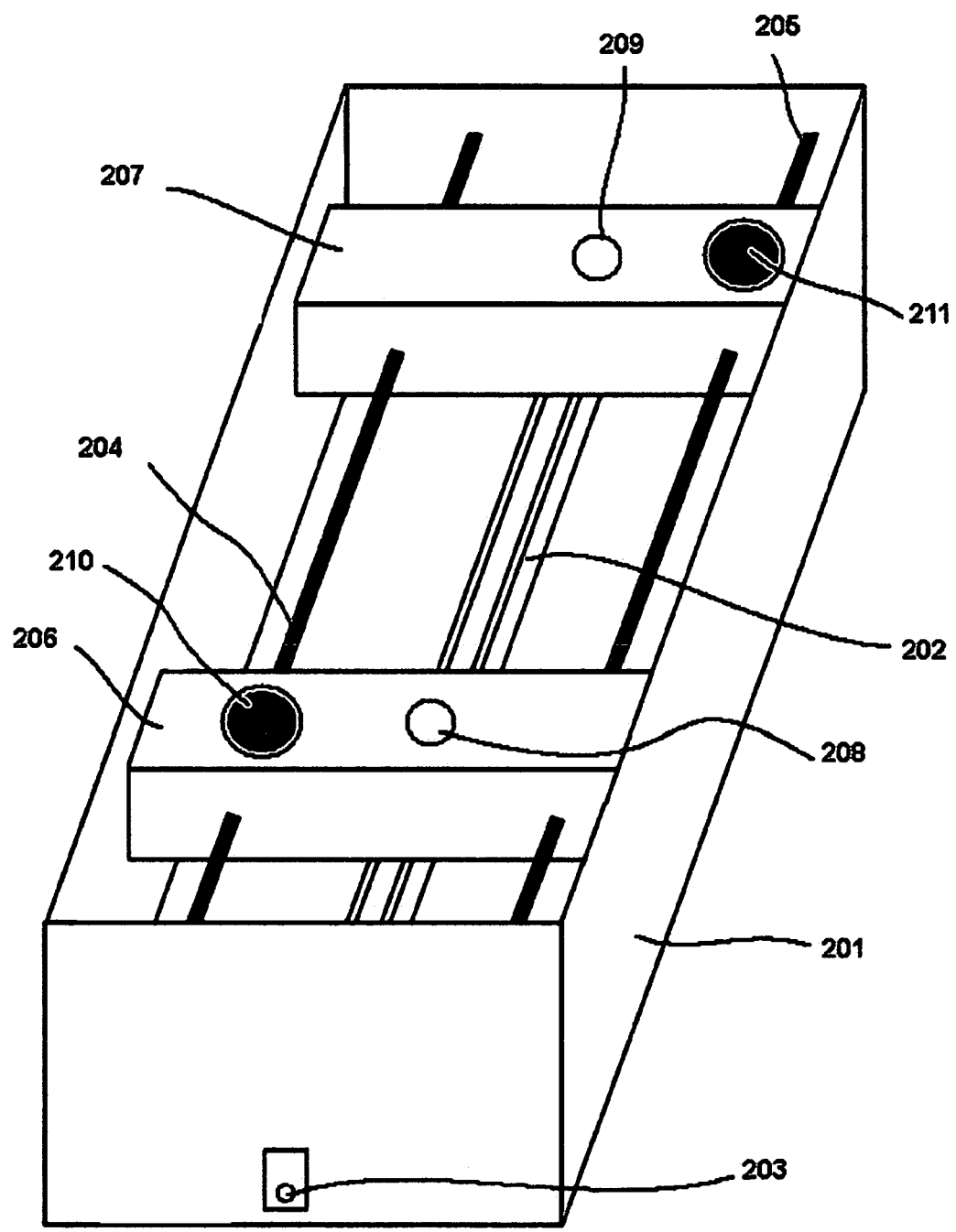
FIG. 15: depicts an interferometric load-pull tuner

The interferometric load-pull tuner consists of housing (201), a slab-line (100, 202,301) with a characteristic impedance Z0. The slab-line contains two identical moveable RF slugs (102,103) or (303,304), equal in sizes and materials, that slide between the inner conductor (101,111,203,302) and the outer conductor (100, 202,301). Each slug is mechanically linked to a mobile carriage (206,207) trough a mechanical link (208,209) like a screw. The slugs are horizontally positioned in the slab-line by the said mobile carriages (206,207), which are driven by two lateral mechanisms such as driving screws (204,205), which themselves are controlled by stepping motors (210,211). The sections of line containing the slugs have a characteristic impedance ZS, which is lower than Z0. The central conductor of the slab-line (100, 202,301) can have a rectangular cross-section (111) or a circular cross-section (101). Both RF slugs are sliding on the central conductor of the slab-line. The parallelepipedic RF slugs, with appropriate cavity in order to surround only partially the central conductor and be manually extractable from the slab-line, can be:

fully dielectric (104,112) as shown in FIGS. 7 and 11, air/dielectric (105,113) as shown in FIGS. 8 and 12, where the dielectric RF slug has two spaces of air on both external side of the slug, dielectric (106,114)/metal (107,108,115,116) as shown in FIGS. 9 and 13, where the metallic slabs (107,108,115,116) on both external side of the RF slug have a perfect electrical contact with the outer conductor (100,202, 301), metal (109,117)/dielectric (110,118) as shown in FIGS. 10 and 14, where the metallic RF slugs (109,117) have a perfect contact with the outer conductor (100, 202,301) and the cavity of the metallic slug, surrounding the central conductor, is covered by a dielectric (110,118).

All RF slugs of this invention have a dielectric contact with the central conductor and are sliding on the said central conductor.

The magnitude of the reflection coefficient is determined by the spacing of the slugs according to the interferometric principle. If the slug separation is held constant, the magnitude of the reflection coefficient does not change. As the two slugs are moved together, the phase angle of the reflection coefficient changes, because the distance between the slugs and the reference plane is changing.

It is essential for both slugs to be identical in order to make the tuner transparent, i.e. look like a Z0 impedance line. For this reason also, it is essential that the two slugs could be placed as close as possible in order to minimize the inter-slug distance. It is well known that insertion loss in transmission lines is proportional to the electric length of the transmission section amounting to a number of decibel [dB] per wavelength. Therefore, in order to minimize the losses between the two slugs and therefore keeping the reflections produced by the two slugs as equal as possible, it is essential to be able to move both slugs as close as possible.

It is essential for the slugs to not surround the central conductor of the transmission line in order to be manually extractable from the slab-line during the calibration process.

It is an aspect of the present invention to provide an exact 3-terms T-Parameters calibration procedure to calculate the S-Parameters of the interferometric load-pull tuner. In accordance with the well-known transmission line theory, and particularly to the 2*2 matrix scattering transfer parameters T-Parameters (T11,T12,T21,T22) describing transmission line sections of different impedances, the interferometric load-pull tuner during the calibration process can be represented by 7 scattering transfer matrixes. Matrixes TA, TB and TC represent transmission lines of impedance Z0 according to FIGS. 16, 17, 18 and 19. T1(ZS,X1$n$) represents the transmission line of the first slug (303) with impedance ZS when the first slug is inserted into the slab-line at position X1$n$ according to FIGS. 16 and 17. T1(Z0) represents the transmission line of impedance Z0 equivalent to the length of the first slug when the said first slug is extracted from the slab-line according to FIGS. 18 and 19. T2(ZS,X2$m$) represents the transmission line of the second slug (304) with impedance ZS when the second slug is inserted into the slab-line at position X2$m$ according to FIGS. 16 and 19. T2(Z0) represents the transmission line of impedance Z0 equivalent to the length of the second slug when the said second slug is extracted from the slab-line according to FIGS. 17 and 18.

Figure 16:
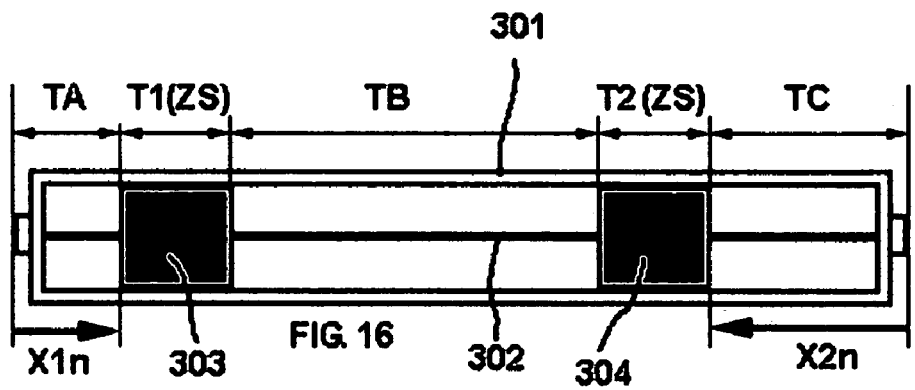
FIG. 16: depicts an interferometric load-pull tuner radio-frequency equivalence that comprises 5 cascaded section of transmission lines.
Figure 17:
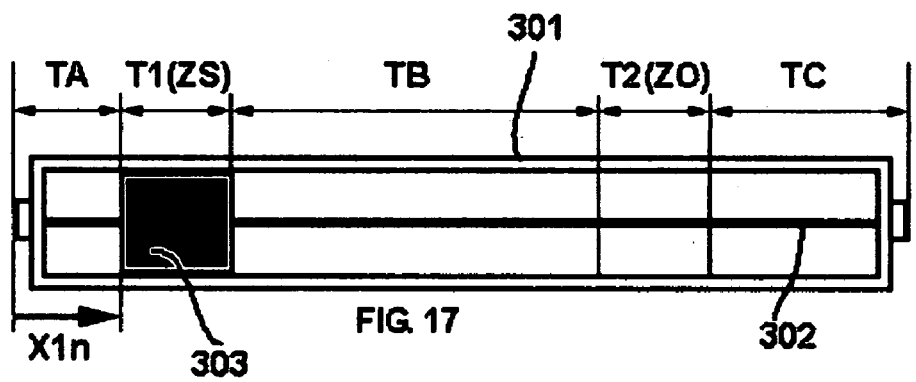
FIG. 17: depicts an interferometric load-pull tuner radio-frequency equivalence during calibration process, with slug 2 extracted from the slab-line
Figure 18:
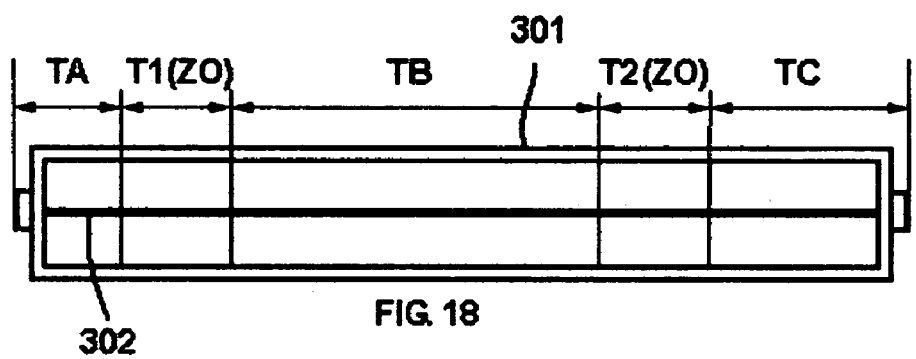
FIG. 18: depicts an Interferometric load-pull tuner radio-frequency equivalence during calibration process, with slug 1 and slug 2 extracted from the slab-line
Figure 19:
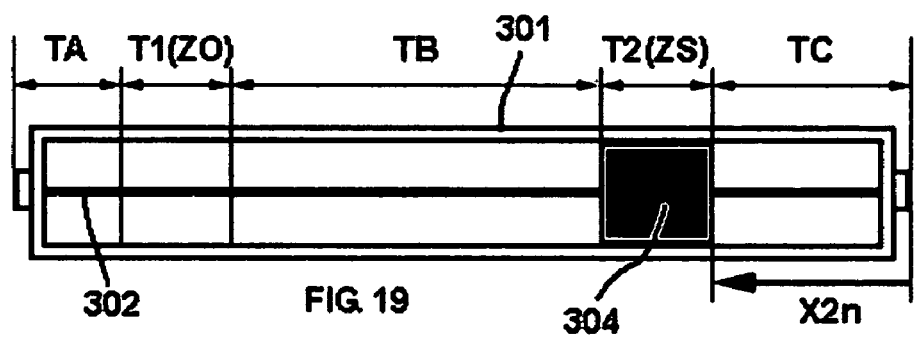
FIG. 19: depicts an interferometric load-pull tuner radio-frequency equivalence during calibration process, with slug 1 extracted from the slab-line.

The corresponding calibration method is a three steps process described by FIGS. 17, 18 and 19. We are going to demonstrate that the three-terms cascade procedure proposed with this invention is an exact solution for calculating the T-Parameters of the interferometric load-pull tuner, TUNER(X1$n$,X2$m$) as described in FIG. 16. Using the superposition principle, we show that the influence of the first slug only, represented by TERM1(X1$n$) (FIG. 17), cascade with the inverse of the T-Parameters of the empty slab-line, represented by TERM2 (FIG. 18) and finally cascade with the influence of the second slug only, represented by TERM3(X2$m$) (FIG. 19) will correspond to the T-Parameters of the tuner with both slugs in the slab-line (FIG. 16), first slug being at position X1$n$ and second slug being at position X2$m$, as follows:

$$TUNER(X1_N, X2_M) = TERM1(X1_N) * TERM2 * TERM3(X2_M)$$

Step 1 consists of manually extracting the second slug from the slab-line according to FIG. 17, measuring the S-Parameters of the tuner and saving the corresponding T-Parameters for different horizontal positions X1$n$ of the first slug along the longitudinal axis of the slab-line. The T-Parameters measured at this step correspond to a list of TERM1, corresponding to the different positions X1$n$ of the first slug in the slab-line, as follows:

$$TERM1(X1_N) = TA * T1(Z_S, X1_N) * TB * T2(Z_0) * TC$$

Step 2 consists of manually extracting the first and second slugs from the slab-line according to FIG. 18, and measuring the S-Parameters and calculating the corresponding T-Parameters. The T-Parameters measured at this step correspond to:

$$TA*T1(Z_0)*TB*T2(Z_0)*TC$$

It should be noted that this term is inverted thus giving TERM2 as follows:

$$\text{TERM2} = [TA*T1(Z_0)*TB*T2(Z_0)*TC]^{-1} = TC^{-1}*T2(Z_0)^{-1}*TB^{-1}*T1(Z_0)^{-1}*TA^{-1}$$

Step 3 consists of manually extracting the first slug from the slab-line according to FIG. 19, measuring the S-Parameters of the tuner and saving the corresponding T-Parameters for different horizontal positions $X2m$ of the second slug along the longitudinal axis of the slab-line. The T-Parameters measured at this step correspond to a list of TERM3, corresponding to the different positions $X2m$ of the second slug in the slab-line, as follows:

$$\text{TERM3}(X2_M) = TA*T1(Z_0)*TB*T2(Z_S, X2_M)*TC$$

Finally, the 3-terms cascade will provide the tuner T-Parameters:

$$\text{TERM1}(X1_N)*\text{TERM2}*\text{TERM3}(X2_M) ==$$
$$(TA*T1(Z_S, X1_N)*TB*T2(Z_0)*TC)*$$
$$(TC^{-1}*T2(Z_0)^{-1}*TB^{-1}*T1(Z_0)^{-1}*TA^{-1})*$$
$$(TA*T1(Z_0)*TB*T2(Z_S, X2_M)*TC) == TA*$$
$$T1(Z_S, X1_N)*TB*T2(Z_S, X2_M)*TC =$$
$$\text{TUNER}(X_1, X2_M)$$

last expression corresponding to the exact formulation of the tuner with both slugs into the slab-line according to FIG. 16, first slug (303) being at position $X1n$ and second slug (304) being at position $X2m$.

Advantages of the interferometric load-pull tuner over the double-slug tuner discussed in the article "Automatic Load Contour Mapping for Microwave Power Transistors" by J. M. Cusack, S. M. Perlow and B. S. Perlman, in IEEE Transactions on Microwave Theory and Techniques, Vol. MTT-22, No. 12, December 1974:

This invention uses a slab-line instead of a coax-line as transmission line making slugs design and control much easier, providing a bigger frequency bandwidth of use and a bigger gamma tuning range.

This invention uses manually extractable slugs, which are not fully surrounding the central conductor of the slab-line, allowing a 3 steps calibration procedure using the superposition principle.

In order to calculate the tuner S-Parameters, this invention uses a three-terms T-Parameters multiplication procedure from measured data instead of using a transmission line model which does not provide good accuracy at high gamma.

Advantages of the interferometric load-pull tuner over the double slide-screw tuner described in U.S. Pat. No. 6,674,293:

This invention does not require vertical control of the slugs with associated motors which give a much simpler mechanical design, improving the tuning accuracy at high gamma and allowing a lower cost of production.

Since the slugs slide on the central conductor, no alignment procedure of the slugs displacement compare to the central conductor is required, making the assembly of the interferometric load-pull tuner easier and allowing a lower cost of production.

The slugs of the interferometric load-pull tuner have a dielectric contact with the central conductor and the distance of metallic parts of the slugs if any, stay constant during operation of the tuner, providing predictable and constant power handling.

In order to calculate the tuner S-Parameters, this invention uses an exact three-terms calculation procedure while the two calibration procedures described in the U.S. Pat. No. 6,674,293 patent are only based on approximations, therefore increasing the accuracy of measurements.

The U.S. Pat. No. 6,674,293 patent, being in fact two slide-screw tuners connected in series, provides a system with 4 axis of freedom (2 slugs, and for each slug, 2 axis of freedom, one horizontal and one vertical), while 2 axis of freedom are only required to cover the full Smith chart. This overdetermined system is solved with a described prematching and tuning technique that limits the tuning region and provides a strong interpolation problem. In the contrary, the interferometric load-pull tuner, having just the 2 required axis of freedom (2 horizontal control for each slug) covers the full Smith chart in a non-ambiguous fashion.

Finally, expressions such as "perfect", "equal" and "identical" have been used in the present description and in the following claims. However, it will be understood that these expressions, and other like them, are used in the context of theoretical calculations, but in practice mean "as close as possible" to the theory.

Although the present invention has been explained hereinabove by way of a preferred embodiment thereof, it should be pointed out that any modifications to this preferred embodiment within the scope of the appended claims is not deemed to alter of change the nature and scope of the present invention.

I claim:

1. An electromechanical interferometric load-pull tuner having an input and an output, comprising a slab-line with longitudinal axis, in which two identical RF slugs controlling the fundamental frequency are sliding along the said slab-line by means of electrical remote control, said two identical RF slugs are partially surrounding the central conductor of said slab-line in order to be extractable from said slab-line by vertical withdrawal and this vertical movement does not provide tuning.

2. An electromechanical interferometric load-pull tuner as in claim 1, where the said central conductor has a circular cross-section perpendicularly to said longitudinal axis of said slab-line.

3. An electromechanical interferometric load-pull tuner as in claim 1, where the said central conductor has a rectangular cross-section perpendicularly to said longitudinal axis of said slab-line.

4. An electromechanical interferometric load-pull tuner as in claim 1, where the said two identical RF slugs are two identical metallic rectangular parallelepiped, said metallic rectangular parallelepiped having a cavity which is partially surrounding the said central conductor in order to be extractable from said slab-line by vertical withdrawal, said cavity being covered by a dielectric material.

5. An electromechanical interferometric load-pull tuner as in claim 1, where the said two identical RF slugs are two identical dielectric rectangular parallelepiped, said dielectric rectangular parallelepiped having a cavity which is partially surrounding the said central conductor in order to be extractable from said slab-line by vertical withdrawal.

6. An electromechanical interferometric load-pull tuner as in claim 1, where the said two identical RF slugs are two identical dielectric rectangular parallelepiped, said dielectric rectangular parallelepiped having two spaces of air parallel to the outer conductors of said slab-line, said dielectric rectangular parallelepiped having a cavity which is partially surrounding the said central conductor of said slab-line in order to be extractable from said slab-line by vertical withdrawal.

7. An electromechanical interferometric load-pull tuner as in claim 1, where the said two identical RF slugs are two identical dielectric rectangular parallelepiped, said dielectric rectangular parallelepiped having two metallic slabs parallel to the outer conductors of said slab-line, said dielectric rectangular parallelepiped having a cavity which is partially surrounding the said central conductor of said slab-line in order to be extractable from said slab-line by vertical withdrawal.

8. An electromechanical interferometric load-pull tuner as in claim 1, where the said electrical remote control comprises two electrical motors for the parallel movement of the said two identical RF slugs along the said longitudinal axis of said slab-line in order to be extractable from said slab-line.

9. An exact three-terms method for calculating the scattering parameters (S-Parameters) of an electromechanical interferometric load-pull tuner as in claim 1, consisting of measuring its scattering transfer parameters (T-Parameters) in a sequence of the following steps, said two identical RF slugs consisting of first slug and second slug:

(a) extracting said second slug from said slab-line, measuring the S-Parameters of said tuner and saving the corresponding T-Parameters in a data base for different horizontal positions X1$n$ of said first slug along said longitudinal axis of said slab-line, providing a list of TERM1(X1$n$) where said TERM1 is the T-Parameters matrix of the said tuner for said different horizontal positions X1$n$ of said first slug along said longitudinal axis of said slab-line, (b) extracting said first slug and said second slug from said slab-line, measuring the S-Parameters of said tuner, calculating the corresponding T-Parameters, inverting the said T-matrix and saving in said data base, providing TERM2 where said TERM2 is the inverted T-Parameters matrix of said tuner with said two identical RF slugs extracted from said slab-line;

(c) extracting said first slug from said slab-line, measuring the S-Parameters of said tuner and saving the corresponding T-Parameters in said data base for different horizontal positions X2$m$ of said second slug along said longitudinal axis of said slabs line, providing a list of TERM3(X2$m$) where said TERM3 is the T-Parameters matrix of the said tuner for said different horizontal positions X2$m$ of said second slug along said longitudinal axis of said slab-line;

(d) calculating the S-Parameters of the said interferometric load-pull tuner having the said two identical RF slugs into said slab-line, said first slug being at position X1$n$, said second slug being at position X2$m$, according to the said exact three-terms method matrix multiplication: said tuner T-Parameters(X1$n$,X2$m$)=TERM1(X1$n$)*TERM2*TERM3(X2$m$) and calculating the corresponding S-Parameters.

* * * * *